(12) United States Patent
Schwaab et al.

(10) Patent No.: US 7,642,948 B2
(45) Date of Patent: Jan. 5, 2010

(54) REFLECTIVE LAYER

(75) Inventors: Gilles Schwaab, Dortmund (DE); Jörn Schröer, Herdecke (DE); Björn Lunau, Wetter (DE)

(73) Assignee: Ewald Dorken AG, Herdecke (DE)

( * ) Notice: Subject to any disclaimer, the term of this patent is extended or adjusted under 35 U.S.C. 154(b) by 463 days.

(21) Appl. No.: 10/568,401

(22) PCT Filed: Aug. 12, 2004

(86) PCT No.: PCT/EP2004/009046

§ 371 (c)(1),
(2), (4) Date: Feb. 13, 2006

(87) PCT Pub. No.: WO2005/018297

PCT Pub. Date: Feb. 24, 2005

(65) Prior Publication Data

US 2008/0231977 A1    Sep. 25, 2008

(30) Foreign Application Priority Data

Aug. 14, 2003  (DE) .............................. 103 37 792
Dec. 23, 2003  (DE) .............................. 103 61 484

(51) Int. Cl.
*H01Q 17/00* (2006.01)
(52) U.S. Cl. .................... 342/1; 342/3; 342/4; 342/5
(58) Field of Classification Search ............... 342/1–5
See application file for complete search history.

(56) References Cited

U.S. PATENT DOCUMENTS

| | | | |
|---|---|---|---|
| 3,568,196 A * | 3/1971 | Bayrd et al. ................... 342/4 |
| 3,733,606 A * | 5/1973 | Johansson ...................... 342/3 |
| 3,773,684 A * | 11/1973 | Marks ......................... 252/583 |
| 5,003,311 A * | 3/1991 | Roth et al. ..................... 342/4 |
| 5,258,596 A * | 11/1993 | Fabish et al. ................. 219/728 |
| 5,394,149 A * | 2/1995 | Fujita et al. .................... 342/1 |
| 5,453,745 A * | 9/1995 | Kudo et al. ..................... 342/1 |
| 5,525,988 A * | 6/1996 | Perkins et al. ................. 342/4 |
| 5,561,428 A * | 10/1996 | Czaja et al. .................... 342/1 |
| 5,786,785 A * | 7/1998 | Gindrup et al. ................. 342/1 |
| 6,245,434 B1 * | 6/2001 | Shinozaki et al. ........... 428/472 |
| 6,797,401 B2 * | 9/2004 | Herron ........................ 428/553 |
| 7,136,008 B2 * | 11/2006 | Aisenbrey ...................... 342/4 |
| 7,420,500 B2 * | 9/2008 | Treen et al. .................... 342/4 |

(Continued)

FOREIGN PATENT DOCUMENTS

DE    28 28 576 A1    1/1979

(Continued)

*Primary Examiner*—John B Sotomayor
(74) *Attorney, Agent, or Firm*—Bachman & LaPointe, P.C.

(57) ABSTRACT

A reflective layer for attenuating electromagnetic radiation, the layer comprising at least one reflective component, the latter being selected from the group containing the following substances: carbon particles or fibers, in particular carbon black and/or graphite and/or an electrically conductive graphite compound, metal particles and/or fibers, in particular copper, aluminum, steel, titanium and/or iron particles of fiber and metal alloy particles. The reflective layer is characterized in that it attenuates electromagnetic radiation in a 200Hz to 10 Ghz range by more than 10Db, that it watertight and permeable to water vapor, in addition to being resistant to the elements and designed to produce a potential compensation. The invention also relates to a method for assembling the reflective layer.

32 Claims, 1 Drawing Sheet

1 = Reflective layer
2 = Reflective component or mixture of reflective components
3a = electromagnetic radiation
3b = reflected electromagnetic radiation
4a = water vapour
4b = transmitted water vapour
5a = liquid water (drop)
5b = repulsed liquid water (drop)

U.S. PATENT DOCUMENTS

2005/0035896 A1* 2/2005 Fujieda et al. .................. 342/1
2008/0231977 A1* 9/2008 Schwaab et al. ............ 359/838

FOREIGN PATENT DOCUMENTS

| | | |
|---|---|---|
| DE | 28 42 519 A1 | 4/1980 |
| DE | 33 00 158 A1 | 7/1984 |
| DE | 35 34 059 C1 | 5/1990 |
| DE | 39 16 416 A1 | 11/1990 |
| DE | 40 18 452 A1 | 12/1991 |
| DE | 94 11 193 U1 | 5/1995 |
| DE | 296 11 617 U1 | 9/1997 |
| DE | 197 47 622 A1 | 4/1999 |
| DE | 100 41 526 A1 | 3/2002 |
| DE | 103 34 714 A1 | 4/2004 |
| EP | 0 742 095 A3 | 3/1996 |
| EP | 0 742 095 A2 | 11/1996 |
| EP | 0 795 927 A1 | 11/1996 |
| JP | 04352395 A * | 12/1992 |
| WO | WO 02/064207 A1 | 8/2002 |

* cited by examiner

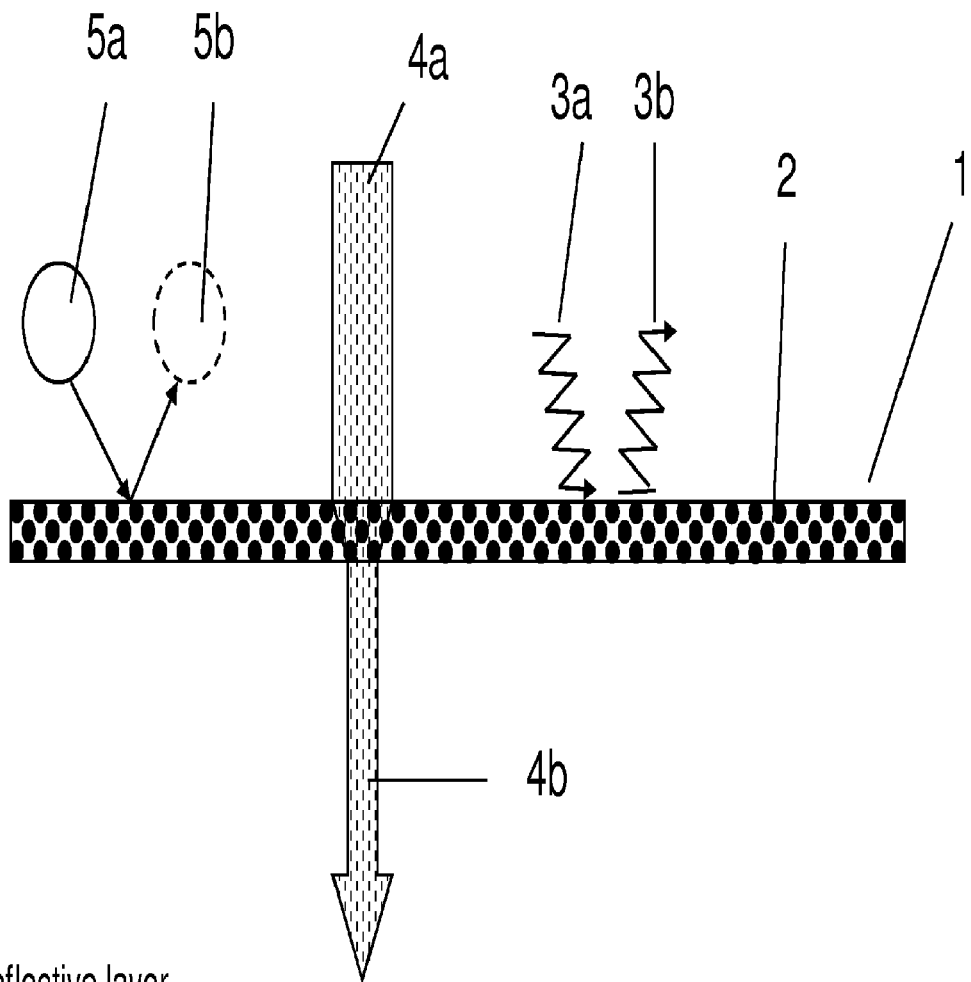
1 = Reflective layer
2 = Reflective component or mixture of reflective components
3a = electromagnetic radiation
3b = reflected electromagnetic radiation
4a = water vapour
4b = transmitted water vapour
5a = liquid water (drop)
5b = repulsed liquid water (drop)

REFLECTIVE LAYER

BACKGROUND OF THE INVENTION

The invention relates to a reflective layer for the reflection of electromagnetic radiation and to a process for attenuating electromagnetic radiation.

The screening of residential and working premises as well as equipment against undesirable electromagnetic radiation gains increasing importance. Initially, in particular for the screening of premises interiors, special products were developed, nettings or non-woven webs of metal, in particular copper or of plastics into which metal fibres have been incorporated or vapour-coated with metal, in particular aluminium. Examples of this are Sisalex 514 of the firm Ampack, a composite of craft paper with inserted glass fibre netting and aluminium lamination, the protective panel "LaVita" of Knauf or the fabric "Cuprotect special" of the firm Kessel. Fabrics are marketed by the firm Biologa ("Picasso") and the firm Genitex ("Genitnet 36"). The screening action is quite satisfactory, however these products provide only this single function. By their very nature, these products intended for interior application are neither waterproof nor weather-resistant.

For applications in exterior cladding and roofing, products have also been developed which are supposed to screen against electromagnetic radiation. In this context, in particular the products "Profilwelle und Sidings" of the firm Prefa (aluminium cladding elements), the "Sto-Abschirmvlies" of the firm AES (reinforcing fabric for thin layers of plaster), "XUND-E" a protective panel of natural plaster of Paris with a thin carbon coating of the firm Baufritz, "PIR-E-Protect", an insulating panel coated on both sides with aluminium of the firm Bauder and "Delta-Reflex", an aluminium-coated vapour barrier of the applicant should be mentioned. Although these products are already each suitable for two applications (e.g. insulation and screening or exterior cladding and screening), they are either not waterproof or—if waterproof—they are not water-vapour pervious.

The product "TOP-E-Protect" of the firm Bauder, a bituminised, laminated sheeting in which between a bitumen layer and a non-woven fabric a metal vapour coating had been applied, is watertight as well as pervious to water vapour.

If a vapour-coated layer has been furnished with a weatherproof coating—e.g. a bitumen coating—the vapour barrier can only be provided with potential compensation at unacceptable cost—if at all. The metal vapour coating, in practice, usually has only very limited inadequate weather resistance. The reason is that generally metal vapour coatings are employed of inexpensive and conventional types which are adversely affected by liquid water, in particular in the presence of atmospheric oxygen. The coatings are easily washed off and corroded, whereafter the conductivity of such reflective layer is no longer present.

Considering that even the highly adaptable TOP-E-Protect weatherproofing under layer of the firm Bauder, although suitable for multiple purposes, apart from its lacking weathering resistance, is unsuitable for connecting a potential compensation, its attenuation of electromagnetic radiation leaves much to be desired, because the protective sheeting itself returns part of the radiation back into the premises to be screened off. The undesirable effect of non-existing earthing becomes particularly noticeable if it is appreciated that such reflective layers transmit the fields issued by close-by power lines.

SUMMARY OF THE INVENTION

Accordingly, there is a need for a universally employable reflective layer, which reflects electromagnetic radiation and which is at the same time waterproof as well as permeable to water vapour and weather-resistant and which allows a potential compensation means to be applied.

It is the object of the invention to provide such a reflective layer.

This object is attained by a reflective layer for the attenuation of electromagnetic radiation, including a reflective layer including at least one reflective component, characterised in that for the reflective layer, serving as reflective component, a substance or a mixture of the group of the following substances is selected: carbon particles or fibres, in particular carbon black and/or graphite and/or an electrically conductive graphite composition, metal particles and/or fibres, in particular copper, aluminium, steel, titanium and/or iron particles or fibres as well as particles of a metal alloy, that the reflective layer attenuates electromagnetic radiation in a range of 16 Hz up to 10 GHz, preferably in a range of 200 MHz up to 10 GHz, by more than 10 dB, that the reflective layer is waterproof and water vapour pervious; that the reflective layer is weather-resistant, and that the reflective layer is adapted for applying a potential compensation means.

BRIEF DESCRIPTION OF THE DRAWING

The FIGURE schematically illustrates a reflective layer according to the invention.

DETAILED DESCRIPTION

A reflective layer 1 of a reflecting component 2 was found to be a surprisingly effective means for screening against electromagnetic radiation 3a, 3b, which satisfies the multiple requirements of durability, waterproofness and the possibility for earthing the reflective layer. In its simplest case, the reflective layer according to the invention takes the form of a micro-perforated metal layer, which is rendered water vapour pervious by the perforation (See FIGURE, which shows arrows 4a, 4b representing transmitted water vapour, and repulsed droplets 5a, 5b schematically representing waterproofness).

If the reflective layer consists of metal or metal alloy, the reflective layer is employed both for screening against so-called electro smog as well as for reflecting thermal radiation, both being forms of electromagnetic radiation. Electromagnetic radiation also includes UV-radiation and visible light. To the extent that in the context of reflective layers in what follows reference is made to electromagnetic radiation, it is assumed that at least that range of wavelength of electromagnetic radiation is attenuated which gives rise to electro smog. However, it is not to be excluded that radiation of other wave length ranges, in particular the infrared range, will be reflected.

Multiple applications can, however, be found for a reflective layer according to the invention, in which the reflective component is combined with a binder. Such a reflective layer is essentially characterised by the properties of whatever binder is employed. Known are inter alia binders which are waterproof, i.e. resisting up to 200 mm water column—and sometimes more—and which at the same time are water vapour pervious, i.e. having an Sd-value below 30 cm.

It has been found that by incorporation of reflective components, such binders are rendered suitable for the preparation of multiple-use reflective layers which are not only suitable for screening against electromagnetic radiation, but which, in addition, perform a waterproofing and protective action for the protection of e.g. buildings. Thus, the entire reflective layer, in particular if manufactured using such binder, preferably has a diffusion equivalent air layer thickness Sd of at the most 30 cm. This ensures that a water vapour pervious reflective layer is provided which accordingly can be used for multiple purposes.

A wide range of synthetic resin compositions are available as binders. Single component compositions as well as dual component compositions may be employed. Typically employed are, for example, acrylic resins or polyurethane resins. Epoxy resins are also possible in principle, however they only provide the formation of very brittle layers of poor flexibility. The binder is selected in accordance with the reflective component as well as, where applicable, the substrate layer.

Further additives may optionally be added to the binder before, during or after the addition of the reflective component. This may for example be a dispersing agent for providing a uniform distribution of the reflective component; it may also be an additive against brittleness of the reflective layer which improves the aging resistance of the reflective layer according to the invention. Also added may be stabilisers, softening agents and, optionally, filler substances which serve to add to the desired volume of the reflective layer. Flame retardants are also frequently added which improve the fire protection properties of the product.

Screening takes place in a wide frequency range of from 16 Hz up to 10 GHz, preferably in a range of 200 MHz up to 10 GHz. An attenuation of at least 10 dB is attained over the entire frequency range. Depending on the nature of the reflective component used or of the binder employed, considerably higher attenuation values may be attained in sections over different frequency ranges. Either over the entire frequency range or only in portions thereof the electromagnetic radiation is attenuated by more than 10 dB, in particular by at least 15 dB, preferably by more than 20 dB.

The selection of a suitable reflective component and/or the incorporation in a binder provide a good weather resistance. A weather resistance in which the attenuating properties of the reflective layer are preserved almost without change after at least one month of open weather exposure, demonstrates that the reflective layer according to the invention can be employed reliably under conditions prevailing in practice. Accordingly, the properties of the reflective layer according to the invention, in particular conductivity and—arising therefrom—the screening action—are thus substantially preserved under conditions occurring in practice up to the final installation. The reflective component introduced into a binder is, as a rule, substantially less exposed to the influence of condensation water and atmospheric oxygen, which rapidly attacks and corrodes inexpensive and conventional vapour-coated metal layers. This criterion additionally broadens the fields of application of the reflective layer according to the invention, because—in contrast to metal vapour-coated sheets—the protective effect is even provided if, e.g. when covering a roof, the reflective layer is occasionally exposed for a couple of weeks or months to weathering due to an interruption of building activities.

At the same time, the reflective component in spite of its being embedded in the binder, is not covered or sealed off so that the application of potential compensation is readily possible. Thus, the reflective layer according to the invention can be earthed, and this is to prevent that the reflective layer, even if only slightly charged, will itself emit electromagnetic radiation into the premises to be screened. The application of the potential compensation serves to prevent the reflective layer from absorbing electromagnetic radiation and releasing this into the space to be screened.

A single substance or a mixture of substances may be employed as the reflective component. This single or mixed component is preferably selected from the group of substances: carbon particles or fibres, in particular carbon black and/or graphite and/or electrically conductive graphite compositions, metal particles and/or fibres, in particular copper, aluminium, steel, titanium and/or iron particles or fibres as well as particles of metal alloys. These particles or fibres can readily be mixed into binders and be uniformly distributed therein. If required, a dispersing agent may be added in order to optimise the distribution of the reflective component.

The reflective layer according to the invention retains its reflective properties in the long term, particularly if graphite or an electrically conductive graphite composition has been added as the reflective component to the binder. If necessary, a dispersing agent is added in addition to the mixture of graphite and/or graphite composition in order to ensure a uniform distribution of the reflective component.

Corrosion-resistant metals, metal oxides as well as alloys of metals, but also mixtures of metals or alloys and/or oxides are very suitable as the reflective component. Metals such as chromium, titanium, zinc, iron and/or nickel, oxides of metals such as aluminium oxide or titanium oxide and/or silicon dioxide are very suitable for the production of a reflective layer.

Depending on the nature and form of the reflective component, even amounts as low as about 5 percent by weight of the reflective layer may be adequate to ensure the attenuating effect against the electromagnetic radiation. Such low proportions of reflective component are in particular adequate if e.g. fibrous substances are employed having a high ratio of length to width, which, due to their large surface area provide numerous areas of contact with other fibres. However, it is also quite within the scope of the invention to employ up to 20 weight %, 50 weight % or even more than 75 weight % of reflective component in the reflective layer. It is paramount that adequate reflective component is employed in order to render the reflective layer reflective without interruption. The required content of reflective substance may be determined by simple experiment. One employs either single component substances, e.g. exclusively graphite, aluminium, copper, titanium, iron or steel, or mixtures of several substances, e.g. graphite and metal fibres or metal with metal oxides or metal alloys may be employed, optionally in combination with metal oxides.

According to a particularly advantageous embodiment of the invention, the reflective layer is multiply layered, at least dual layered. In that case at least one layer of the reflective layer comprises a binder and a reflective component. In order to improve the attenuating effect, a second layer of the reflective layer may be provided. For example, it was found to be advantageous to apply onto the reflective layer, according to claim 1, a layer of metal or of a metal alloy, in particular by vapour coating. The degree of attenuation of such a reflective layer is increased very much. However, it is a precondition for the long-term effectiveness of such a vapour-coated metal or alloy layer that this must not be exposed to the environment, neither on the outside nor the inside of the reflective layer, since otherwise the influence of water of condensation and atmospheric oxygen will lead to a rapid degradation of the reflective layer—as is known from the state of the art.

It stands to reason that in the afore described embodiment it is readily possible to apply a further reflective layer according to claim 1 onto the free surface of the metal layer. Such a multiple layer reflective layer is particularly weather-resistant and highly attenuating.

According to a further embodiment of the invention the reflective layer may be applied onto a substrate material. Various foils or non-woven webs may for example be employed as substrate. It is a precondition that the substrate material must be water vapour pervious. The substrate material may be in the form of a single layer or a multiple layer product or as a combination of a foil and a non-woven fabric. It is, moreover, necessary that the binder bonds well to the reflective component on the surface of the substrate. However, this applies to the majority of foils and non-woven fabrics. Particularly preferred are substrates of polyester, polyethylene, polyacrylate, glass fibre, paper, polyamide, polyurethane or textile fibres or mixtures of the aforesaid fibres and/or resin types.

The reflective layer—as is the optionally employed substrate—is water vapour pervious. This is made possible by the characteristics of the reflective layer of binder and reflective components which do not seal the substrate material as would a metal foil. Due to the reflective layer according to the invention being water vapour pervious, the fields of application are greatly broadened, in particular the sheeting can now also be employed as an under layer and as a wall cladding layer for insulating roof or wall surfaces.

A particularly advantageous embodiment of the reflective layer according to the invention provides that the reflective layer is laminated onto a foam layer of a substrate material. The foamed layer is preferably open pore and thereby meets the requirements of waterproofness and water vapour permeability. The application of the reflective layer onto the foam layer permits an economical use of the reflective component as well as, where applicable, the binder.

Such multiple layer products may take the form of strip material or foils, having a material thickness of from about 80 μm up to about 150 μm or more. Multiple layer strip material and foils having a reflective layer are particularly robust and easy to handle.

The invention further relates to a potential compensation means, used for connecting two reflective layers according to the invention. The potential compensation means is either in the form of a metal strip or a strip of metal grating, optionally on a substrate material. As an alternative, the potential compensation means may take the form of a strip-shaped sheet having the properties of the reflective layer according to the invention or may take the form of a single conductive nail—as will be described further below.

A potential compensation means may be applied to the reflective layer in a variety of manners. It may, for example, be adhesively bonded by a conductive adhesive. However, a mechanical application is preferred, for example by press-fitting, interhooking or inter-clawing, whereby electrically conductive sections of the potential compensation means are contacted with the surface or after penetration into the reflective layer are brought into contact with the reflective component. A particularly preferred embodiment of the potential compensation means provides that the reflective layer according to the invention is provided in its marginal region, optionally with an increased content of the reflective component and is then fixed simply by nailing with conductive nails (stainless steel, copper). Particularly if the reflective layer comprises a grid of conductive wires, it is possible to employ nails for earthing the reflective layer, provided the diameter of the nails is larger than the spacing of the wires.

Due to the reflective layer according to the invention being adapted for the application of a potential compensation, it is possible to interrupt an onward transmission of a field. As a rule, the reflective layer is rendered potential free due to the potential compensation so that the reflective layer itself will not transmit electromagnetic radiation or electromagnetic fields into the space to be screened off, in a manner of an aerial. In many products according to the state of the art, this possibility does not exist, whereby the attainable attenuation is limited considerably.

According to a further embodiment of the invention, the reflective layer is of multiple layer design, and at least one layer contains a flame retardant. As a result, the reflective layer according to the invention is usable for a wide field of applications in building. It is to be classified in fire protection class B2. This distinguishes the reflective layer from some competing products which merely attain the fire protective class B3.

Also according to the invention there is provided a process for attenuating electromagnetic radiation in which a waterproof and water vapour pervious reflective layer for the reflection of electromagnetic radiation comprises at least one reflective component and a binder, and in which the reflective layer is designed for potential compensation, applied in such a manner that the reflective layer faces the incident electromagnetic radiation, a potential compensation means is applied and optionally a plurality of reflective layers are interconnected by a potential compensation means.

In this manner it is ensured that the attenuation effect or the reflectivity of the reflective layer according to the invention is utilised to a maximum. An important feature of the process according to the invention is the application of the potential compensation or the interconnection of two adjoiningly laid reflective layers by a potential compensation means in order to avoid an irradiation of the electromagnetic radiation from the reflective layer into the space being screened off.

The reflective layer must face the electromagnetic radiation to be screened off, so that a maximum of incident radiation is taken up and screened off. However, this does not mean that the reflective layer must be on the outside. Typically, when used as an under layer in the roof region or as a wall cladding layer, the desired attenuation is adequately attained by the conventional installation as part of the roof cover or the wall cladding. In such applications, the flexibility of the reflective layer according to the invention proves to be particularly advantageous.

In the following, details of the invention will be further elucidated.

1. Base: Aqueous Dispersions

An acrylate foam rendered flame-resistant is applied as a water vapour pervious base layer onto a polyester non-woven fabric (120 g/m$^2$) as substrate and is dried in two stages at 70 and 170° C.

This intermediate material having a weight per surface area of about 200 g/m$^2$ and an Sd value of 0.02 m serves as substrate for the conductive, screening layer (reflective layer).

1.1 EXAMPLE 1

The intermediate material described under 1 is first vapour-coated with aluminium.

Onto this as a second layer a mixture of graphite and binder is applied: into a polyurethane pre-condensate mixture serving as a binder, 20 weight % of conductive graphite is introduced with stirring to form a homogenous mixture.

This second layer is pre-dried at a temperature of 70° C., hydrophobised and finally dried at 170° C.

The thus formed flexible, diffusion-permitting and waterproof strip material having a surface area mass of 230 g/m² is suitable to be employed as a roof under layer or wall cladding material. The attenuation of the incident electromagnetic waves and further measured properties are reflected in table 1.

TABLE 1

Properties of the strip material of example 1:

|  | New product | After 1 month's exposure to weathering |
| --- | --- | --- |
| Screening in the frequency range 200 MHz up to 10 GHz | >12 dB | >12 dB |
| Water vapour permeability (EN 12572: 0-85/23° C.) | 300 g/m² * d (sd-value 0.16 m) | 300 g/m² * d (sd-value 0.16 m) |
| Water tightness as water column (EN 20811) | >1000 mm | >1000 mm |
| Fireproofing property (DIN 4102) | B2 | B2 |

1.2 EXAMPLE 2

5% by weight carbon fibre, 3 mm long are worked into a polyurethane pre-condensate mixture to form a homogenous mixture. This mixture is applied onto the intermediate material described under 1, pre-dried at a temperature of 70° C., hydrophobised and finally dried at 170° C.

The thus formed flexible, diffusion-permitting and watertight strip material having a mass per surface area of 230 g/m² is suitable to be employed as an under layer or wall cladding layer. The attenuation of the incident electromagnetic waves and further measured properties are reflected in table 2.

TABLE 2

Properties of strip material according to example 2:

|  | New product | After 1 month's exposure to weathering |
| --- | --- | --- |
| Screening in the frequency range 200 MHz up to 10 GHz | >10 dB | >10 dB |
| Water vapour permeability (EN 12572: 0-85/23° C.) | 400 g/m² * d (sd-value 0.10 m) | 400 g/m² * d (sd-value 0.10 m) |
| Water tightness as water column (EN 20811) | >1000 mm | >1000 mm |
| Fireproofing property (DIN 4102) | B2 | B2 |

1.3 Potential Connection for Examples 1 and 2:

For the potential connection an earthing metal sheet is used: this consists of a stainless steel sheet of 0.1 mm thickness and a cable connector riveted thereto for the connection of an earthing cable.

The conductive connection between the layers is attained by means of a conductive strip (aluminium or strips of the layers according to examples 1 or 2), 50 mm wide.

Depending on the field of application, the earthing metal sheet and the connecting strip may be press-fitted (e.g. in the case of under layers) or be bonded on adhesively by means of conductive adhesive.

2. Base Thermoplastic:

EXAMPLE 3

Onto a polyester needle-stitched non-woven (110 g/m²) a thermoplastic polyurethane layer (TPU-layer) of 35 g/m² is extruded in a first operating step. The second operating step comprises an extrusion coating of the first processing step product, likewise with 35 g/m² (TPU-layer) with simultaneous feeding of a PP/stainless steel gauze web 64/32, whereby the web is embedded between the two polyurethane layers.

Properties of the PP/stainless steel-gauze web:

Chain: 32 threads/10 cm PP 32 threads/10 cm stainless steel, 0.08 mm diameter

Weft thread: 32 threads/10 cm stainless steel, 0.08 mm diameter

The so formed flexible, diffusion-permitting and water-tight strip material having a weight per surface area of 270 g/m² has the properties as listed in table 3.

TABLE 3

Properties of the strip material of example 3:

|  | New product | After 1 month's exposure to weathering |
| --- | --- | --- |
| Screening in the frequency range 200 MHz up to 10 GHz | >10 dB | >10 dB |
| Water vapour permeability (EN 12572: 0-85/23° C.) | 260 g/m² * d (sd-value 0.15 m) | 260 g/m² * d (sd-value 0.15 m) |
| Water tightness as water column (EN 20811) | >1500 mm | >1500 mm |

2.1 Potential Connection for Example 3:

Two perforated aluminium strips are embedded on each side of the foil in the second process step between the gauze web and the TPU-layer: the width is 30 mm, the thickness 15 µm; a spacing of 50 mm between the foil edge and the aluminium strip is maintained.

The connection to the potential compensation means and the conductive connection of the overlappings is then brought about quite easily during the application by the use of stainless steel nails in the region of the aluminium strip.

EXAMPLE 4

A typical strip material, which by way of example has the essential features of the invention, comprises a substrate non-woven of polyester with a polyurethane coating having a weight per mass of 70 g/m² for the polyurethane coating. Onto this composite a metal layer of chromium-nickel (20% chromium, 80% nickel) is vapour-coated in a manner known per se. The metal layer has a thickness of 60 nanometers. This non-woven web in a frequency range of 16 Hz up to 10 GHz effects an attenuation of more than 10 dB. The IR-reflection amounts to 65% in the range 2-20 µm wave length. The sd-value is at 0.3 m.

EXAMPLE 5

A gas-pervious film of polypropylene containing 60% chalk as filler was applied onto the non-woven web according to example 1. Onto this gas-pervious film a second non-woven web according to example 1 is in turn applied. The overall weight per surface area of this strip amounts to 160 g/m². The strip is sputtered with titanium, yielding a coating thickness of 60 nanometers. The sd-value amounts to 0.1 m, the coated strip permits diffusion. The IR-reflection is determined to be 43%. The screening against electro smog exceeds 10 db.

EXAMPLE 6

Onto a strip material according to example 1 an alloy of aluminium and magnesium, AlMg3 (25 parts aluminium: 75 parts magnesium) is vapour-coated. The layer thickness is 80 nanometers. By exhibiting an sd-value of 0.35 m the metal-coated strip permits diffusion. The screening against electro smog amounts to 15 dB, the IR-reflection is determined to be 62%.

The invention claimed is:

1. Reflective layer for the attenuation of electromagnetic radiation, comprising at least one reflective layer which includes at least one reflective component, wherein:
   the reflective component comprises a substance or a mixture of substances selected from the group consisting of: carbon particles or fibres, metal particles and/or fibres;
   the reflective layer attenuates electromagnetic radiation in a range of 16 Hz up to 10 GHz by more than 10 dB;
   the reflective layer is waterproof and water vapour pervious;
   the reflective layer is weather-resistant; and
   the reflective layer is adapted for applying a potential compensation means.

2. Reflective layer according to claim 1, wherein the reflective layer attenuates the electromagnetic radiation in a range between 200 MHz and 10 GHz by more than 10 dB.

3. Reflective layer according to claim 1, wherein the reflective component includes a binder.

4. Reflective layer according to claim 1, wherein the reflective layer is of multiple layer structure, wherein at least one layer of the reflective layer includes a mixture of a binder and a reflecting component.

5. Reflective layer according to claim 4, wherein the reflective layer comprises a metal layer.

6. Reflective layer according to claim 5, wherein the metal layer comprises a metal layer formed by vapour-coating.

7. Reflective layer according to claim 4, wherein the reflective layer includes at least one layer having a reflective component composed of a metal or metal alloy and at least one layer including a reflective component of a non-metal.

8. Reflective layer according to claim 1, wherein the binder is a single or dual component resin.

9. Reflective layer according to claim 8, wherein the binder is selected from the group consisting of epoxy resin, polyurethane resin composition and polyacrylate composition.

10. Reflective layer according to claim 1, wherein the binder is water vapour pervious.

11. Reflective layer according to claim 1, wherein the incident electromagnetic radiation in a range of 16 Hz up to 10 GHz is attenuated by more than 15 dB at least regionally.

12. Reflective layer according to claim 11, wherein the incident electromagnetic radiation in a range of 200 MHz up to 10 GHz, is attenuated by more than 20 dB at least regionally.

13. Reflective layer according to claim 1, wherein the reflective layer is designed for mechanical application.

14. Reflective layer according to claim 13, wherein the reflective layer is designed for mechanical application by interhooking of a potential compensation means.

15. Reflective layer according to claim 1, wherein the reflective layer is applied onto a substrate.

16. Reflective layer according to claim 15, wherein the substrate comprises a non-woven web or a foil.

17. Reflective layer according to claim 1, wherein the substrate material is produced of a plastics.

18. Reflective layer according to claim 17, wherein the substrate material is produced of plastics selected from the group consisting of polyester, polyethylene, polyacrylate, glass fibre, paper, polyamide, polyurethane or textile fibres and mixtures thereof.

19. Reflective layer according to claim 1, wherein the reflective layer is in the form of a flexible strip.

20. Reflective layer according to claim 1, wherein the reflective layer has normal flame resistance, being classified as fire protective class B2.

21. Reflective layer according to claim 1, wherein a foamed layer is applied onto the at least one reflective layer.

22. Reflective layer according to claim 21, wherein the foamed layer contains a flame retardant.

23. Reflective layer according to claim 1, wherein in the case of a multiple layer strip including a reflective layer, the reflective layer is provided on the outside or the inside.

24. Reflective layer according to claim 1, wherein a dispersion agent, a softening agent and/or an agent counteracting embrittlement of the reflective layer has been added to the reflective layer.

25. Reflective layer according to claim 1, wherein the reflective layer after an exposure of 1 month to weather attenuates the electro-magnetic radiation incident onto the reflective layer in a range between 16 Hz up to 10 GHz unchanged by more than 10 dB.

26. Potential compensation means for use for connecting two reflective layers according to claim 1, wherein the potential compensation means comprises a metal strip.

27. Reflective layer according to claim 1, wherein the carbon particles or fibres are selected from the group consisting of carbon black, graphite and electrically conductive graphite compositions.

28. Reflective layer according to claim 1, wherein the carbon particles or fibres are selected from the group consisting of copper, aluminium, steel, titanium and iron particles or fibres as well as particles of metal alloys.

29. Reflective layer according to claim 1, wherein the reflective layer after an exposure of 1 month to weather attenuates the electromagnetic radiation incident onto the reflective layer in a range of 200 MHz up to 10 GHz unchanged by more than 10 dB.

30. Potential compensation means for use for connecting two reflective layers according to claim 1, wherein the potential compensation means comprises a metal strip comprising the features of the reflective layer according to claim 1.

31. Process for attenuating electromagnetic radiation, comprising the steps of:
   providing a waterproof and water vapour pervious reflective layer for attenuating electromagnetic radiation including at least one layer of a reflective component and a binder, and in which the reflective layer is adapted for the application of a potential compensation means,
   applying the reflective layer in such a manner that the reflective layer faces the incident electromagnetic radiation, and
   fitting the reflective layer with a potential compensation means.

32. Process according to claim 31, wherein the reflective component comprises a substance or a mixture selected from the group consisting of: carbon particles or fibres, metal particles and/or fibres.

* * * * *

UNITED STATES PATENT AND TRADEMARK OFFICE
CERTIFICATE OF CORRECTION

PATENT NO. : 7,642,948 B2 Page 1 of 1
APPLICATION NO. : 10/568401
DATED : January 5, 2010
INVENTOR(S) : Schwaab et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 789 days.

Signed and Sealed this

Twenty-first Day of December, 2010

David J. Kappos
*Director of the United States Patent and Trademark Office*